United States Patent
Hsu

(10) Patent No.: US 11,276,724 B2
(45) Date of Patent: Mar. 15, 2022

(54) ELECTRICAL INTERCONNECTION OF IMAGE SENSOR PACKAGE

(71) Applicant: SEMICONDUCTOR COMPONENTS INDUSTRIES, LLC, Phoenix, AZ (US)

(72) Inventor: Shou-Chian Hsu, Zhubei (TW)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 28 days.

(21) Appl. No.: 16/455,676

(22) Filed: Jun. 27, 2019

(65) Prior Publication Data

US 2020/0411581 A1 Dec. 31, 2020

(51) Int. Cl.
*H01L 27/146* (2006.01)
*H01L 23/00* (2006.01)

(52) U.S. Cl.
CPC ........ *H01L 27/14636* (2013.01); *H01L 24/13* (2013.01); *H01L 27/14618* (2013.01); *H01L 27/14687* (2013.01); *H01L 2224/13024* (2013.01); *H01L 2224/13147* (2013.01)

(58) Field of Classification Search
CPC ......... H01L 27/14636; H01L 27/14618; H01L 27/14687; H01L 2224/13024; H01L 2224/13147; H01L 24/13
See application file for complete search history.

(56) References Cited

U.S. PATENT DOCUMENTS

| 10,418,396 | B1 * | 9/2019 | Wu ................... H01L 27/14618 |
| 2007/0152148 | A1 | 7/2007 | Chao et al. |
| 2014/0191350 | A1 * | 7/2014 | Chen ................. H01L 27/14687 257/432 |
| 2015/0255500 | A1 * | 9/2015 | Akahoshi ........ H01L 31/022408 257/434 |
| 2016/0141280 | A1 * | 5/2016 | Lin ................... H01L 27/14687 257/292 |
| 2016/0322273 | A1 | 11/2016 | Wu et al. |
| 2017/0200755 | A1 | 7/2017 | Teng et al. |

(Continued)

OTHER PUBLICATIONS

Lin, et al., Encapsulated Wafer Level Chip Scale Package (eWLCSP) for Cost Effective and Robust Solutions in FlexLine, 2014 IEEE International Microsystems, Packaging, Assembly and Circuits Technology Conference (IMPACT), 2014, 5 pages.

(Continued)

*Primary Examiner* — Lex H Malsawma

(74) *Attorney, Agent, or Firm* — Adam R. Stephenson, Ltd.

(57) ABSTRACT

Implementations of semiconductor packages may include: a semiconductor die having a first side and a second side and an active area on the second side of the die. The semiconductor packages may also include two or more bumps coupled to two or more die pads on a second side of the die. The semiconductor packages may include an optically transmissive lid coupled to the semiconductor die through an adhesive, two or more bumps, and a first redistribution layer (RDL). The semiconductor package may include a second redistribution layer (RDL) coupled with the first RDL on the second side of the semiconductor die. The second RDL may extend to the first side of the semiconductor die. The first RDL may extend to an edge of the semiconductor die.

9 Claims, 7 Drawing Sheets

(56) References Cited

U.S. PATENT DOCUMENTS

2019/0172864 A1* 6/2019 Hsu .................. H01L 27/14632
2019/0189667 A1* 6/2019 Jung ................. H01L 27/14636

OTHER PUBLICATIONS

Garrou, Yamada—Wafer Molding for Fan-out Packages, Insights from Leading Edge, Oct. 2016, p. 4.
Huang, et al., Image Sensor Advanced Package Solution, SEMICON Taiwan 2013, 24 pages.

* cited by examiner

ELECTRICAL INTERCONNECTION OF IMAGE SENSOR PACKAGE

BACKGROUND

1. Technical Field

Aspects of this document relate generally to semiconductor packages, such as image sensor packages for use in cameras, cell phones, and similar devices. More specific implementations involve image sensor chip scale packages.

2. Background

Semiconductor packages sometimes have through silicon vias (TSVs) to provide electrical interconnection between front side metal pads and backside outer terminals of an image sensor package. Formation of TSVs includes silicon and dielectric etch, isolation lithography, as well as temperature changes during the processing steps.

SUMMARY

Implementations of semiconductor packages may include: a semiconductor die having a first side and a second side and an active area on the second side of the die. The semiconductor packages may also include two or more bumps coupled to two or more die pads on a second side of the die. The semiconductor packages may include an optically transmissive lid coupled to the semiconductor die through an adhesive, two or more bumps, and a first redistribution layer (RDL). The semiconductor package may include a second redistribution layer (RDL) coupled with the first RDL on the second side of the semiconductor die. The second RDL may extend to the first side of the semiconductor die. The first RDL may extend to an edge of the semiconductor die.

Implementations of semiconductor packages may include one, all, or any of the following:

A pad pitch of the two or more bumps may be substantially 60 microns.

The two or more bumps may be copper pillars having solder tips.

A pad pitch of the two or more bumps may be substantially 70 microns.

The two or more bumps may include solder balls.

One or more side walls of the semiconductor die may be angled between 85 degrees and 60 degrees from a plane formed by the first side of the semiconductor die.

Implementations of semiconductor packages may include: a semiconductor die having a first side and a second side. The semiconductor package may also include an active area on the second side of the die and two or more bumps coupled to a second side of the die on either side of the active area. A first redistribution layer (RDL) may be coupled to each of the two or more bumps and may extend to an edge of the semiconductor die. An optically transmissive lid may be coupled to the semiconductor die through the two or more bumps and the first RDL. The semiconductor package may also include a second redistribution layer (RDL) coupled with the first RDL on the second side of the semiconductor die. The second RDL may extend to the first side of the semiconductor die.

Implementations of semiconductor packages may include one, all, or any of the following:

The two or bumps may be coupled to two or more die pads.

A pad pitch of the two or more bumps may be substantially 60 microns.

The two or more bumps may be copper pillars having solder tips.

A pad pitch of the two or more bumps may be substantially 70 microns.

The two or more bumps may include solder balls.

One or more sidewalls of the semiconductor die may be angled between 85 degrees and 60 degrees from a plane formed by the first side of the semiconductor die.

Implementations of semiconductor packages may be formed using implementations of methods for forming semiconductor package. Various method implementations may include: providing an optically transmissive substrate having a first side and a second side and forming a first redistribution layer (RDL) on a first side of the optically transmissive substrate. The first RDL may be formed over one or more scribe lines on the first side of the optically transmissive substrate. The method may also include providing a semiconductor wafer having a first side and a second side. A plurality of active areas may be on the second side of the semiconductor wafer and two or more die pads may be around each of the plurality of active areas. The method may include forming two or more inner bumps on each of the two or more die pads and coupling the second side of the semiconductor wafer to the first side of the optically transmissive substrate. The two or more inner bumps may be coupled on either side of the one or more scribe lines. The method may include thinning the semiconductor wafer to a predetermined thickness and etching the semiconductor wafer to the one or more scribe lines to form a plurality of semiconductor die. The method of forming semiconductor packages may also include singulating through each of the semiconductor die and a metal layer to expose one or more inner terminals of first RDL on the cover glass. The method may also include forming an isolation layer around each of the plurality of semiconductor die. The method may include forming a second redistribution layer (RDL). The second RDL may extend from the inner terminals of the first RDL to the first side of each of the plurality of semiconductor die. The method may include forming a passivation layer over the first side of each of the semiconductor die and singulating through the passivation layer and the optically transmissive substrate to form a plurality of semiconductor packages.

Implementations of methods of forming semiconductor packages may include one, all, or any of the following:

Etching the semiconductor wafer may include angling one or more sidewalls of the semiconductor wafer.

The one or more sidewalls of the semiconductor die may be angled between 85 degrees and 60 degrees from a plane formed by the first side of the semiconductor die after etching.

The method may further include forming one or more dams on the first RDL.

A width of the scribe lines may be less than 150 microns.

Each of the two or more die pads may have a pad pitch of substantially 60 microns.

Each of the two or more die pads may have a pad pitch of substantially 70 microns.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor packages will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor packages, and implementing components and methods, consistent with the intended operation and methods.

Figure 1:
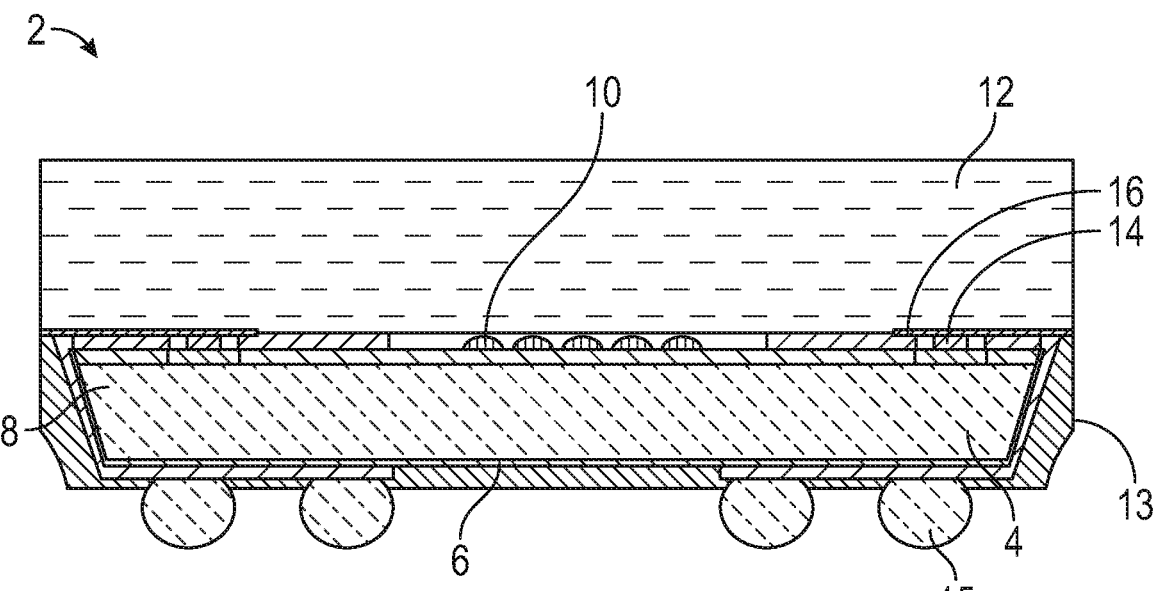
FIG. 1 is a cross sectional view of an implementation of a semiconductor package without through silicon vias (TSVs)

Referring to FIG. 1, an implementation of a semiconductor package 2 is illustrated. The package 2 includes a semiconductor die 4 having a first side 6 and a second side 8. The semiconductor die is an image sensor die having an active area 10 on the second side 8 of the die 4. As illustrated, the sidewalls of the semiconductor die are angled. In various implementations, the angles of the sidewalls may be between 85 degrees and 60 degrees. The angles of the sidewalls may be formed through etching. In some implementations, the etching may be dry etching or wet etching. In various implementations, the semiconductor die may be a different device than an image sensor, such as, by non-limiting example, a processor, a microcontroller, a power semiconductor device, or any other semiconductor device type. An optically transmissive lid 12 is coupled to the semiconductor die 4 through an adhesive, two interconnect bumps 14, and a first redistribution layer (RDL) 16. In various implementations, the optically transmissive lid may include, by non-limiting example, glass, polycarbonate, acrylic, plastics, or other materials that allow some or all of a desired wavelength of light to pass through the material. In various implementations, the adhesive may include, by non-limiting example, epoxy, resin, polymers, glue, and other adhesive materials used in coupling components of semiconductor devices. In other implementations, one or more dams may be coupled between the semiconductor die and the optically transmissive lid.

Figure 2:
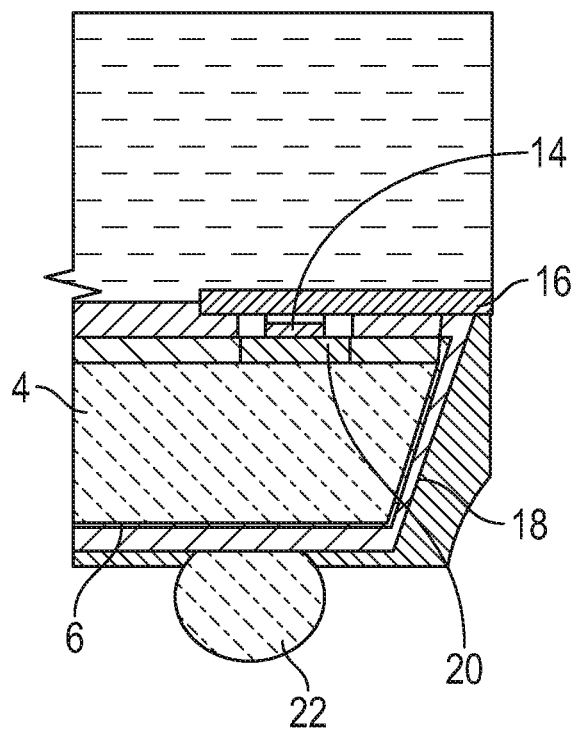
FIG. 2 is a close-up of an implementation of an electrical interconnection route.

Referring to FIG. 2, an expanded view of the interconnect bumps 14, first RDL 16, and second RDL 18 is illustrated. The two bumps 14 are coupled to two die pads or metal pads 20 on either side of the active area of the device. In various implementations, there may be two or more bumps coupled to two or more die pads. The two bumps 14 are coupled with the first RDL 16 to provide mechanical and electrical connection between die pads 20 on the second side of the semiconductor die and a second RDL 18 that is electrically coupled with outer terminals 22 on the first side 6 of the semiconductor die 4. The use of interconnection bumps and two RDLs eliminates the need to form through silicon vias (TSVs) through the semiconductor die material itself. The formation of TSVs can cause thermal and mechanical stress to the semiconductor die. TSV formation can also cause damage to the die pad including cracks and over etching of the pads. Die pad damage can account for most of the failures in current TSV-type image sensor chip scale packages (CSP). The use of interconnect bumps and multiple RDLs may also enable the use of pad pitches that are smaller than 200 microns. For example, semiconductor packages with interconnect bumps may have pad pitches of about 60 microns. In some implementations, the pad pitch may be about 70 microns where the interconnection bumps are copper pillar bumps. In various implementations, the copper pillar bumps may have solder tips. In other implementations, the interconnect bumps may be solder balls.

Referring again to FIG. 1, the semiconductor device includes a passivation layer 13 around the edges and first side of the semiconductor die. In various implementations, the passivation layer may include, by non-limiting example, aluminum oxide, silicon dioxide, silicon nitride, aluminum nitride, and other dielectric materials that have good adhesion, are chemically inert, and/or corrosion resistant. As illustrated, the semiconductor package also includes solder balls 15 coupled to the first side of the semiconductor die. In various implementations, different surface mount interconnects such as pillars or stud bumps may be used. In some implementations, the interconnects may be formed of copper, solder, alloys thereof, or other electrically conductive materials.

Figure 3:
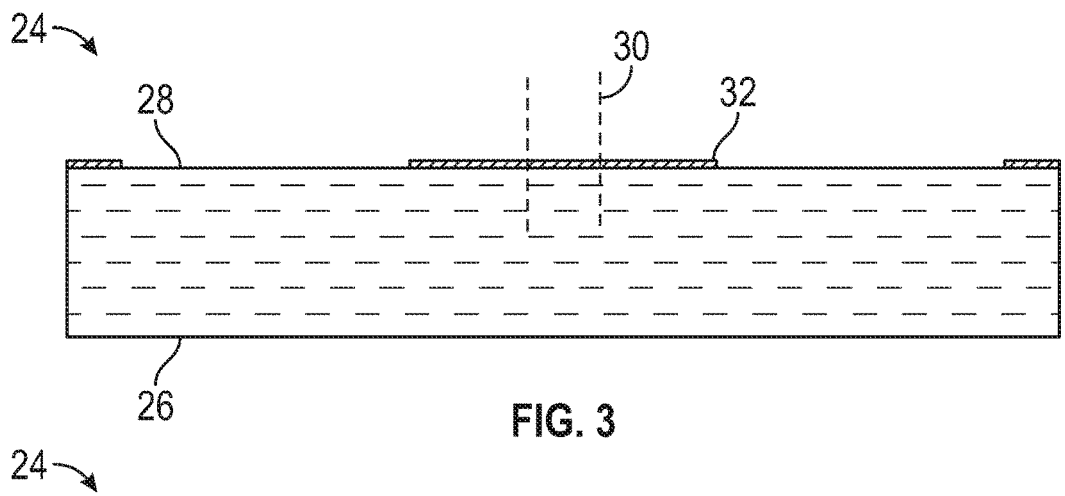
FIG. 3 is a side view of an implementation of an optically transmissive substrate.

Referring to FIG. 3, a side view of an implementation of an optically transmissive substrate is illustrated. In various implementations, the optically transmissive substrate may include, by non-limiting example, glass, polycarbonate, acrylic, plastics, or other materials that allow some or all of a desired wavelength of light to pass through the material. The optically transmissive substrate has a first side 28 and a second side 26. The scribe lines 30 are illustrated on the first side of the optically transmissive substrate in FIG. 3. However, the scribe lines 30 may be visible from either the first side or the second side of the optically transmissive lid. The scribe lines 30 on the optically transmissive substrate may be thinner in methods of forming a semiconductor package having no TSVs as described herein in comparison to methods of forming semiconductor packages having TSVs. By non-limiting example, the scribe lines illustrated may have a thickness of less than 150 microns.

Figure 4:
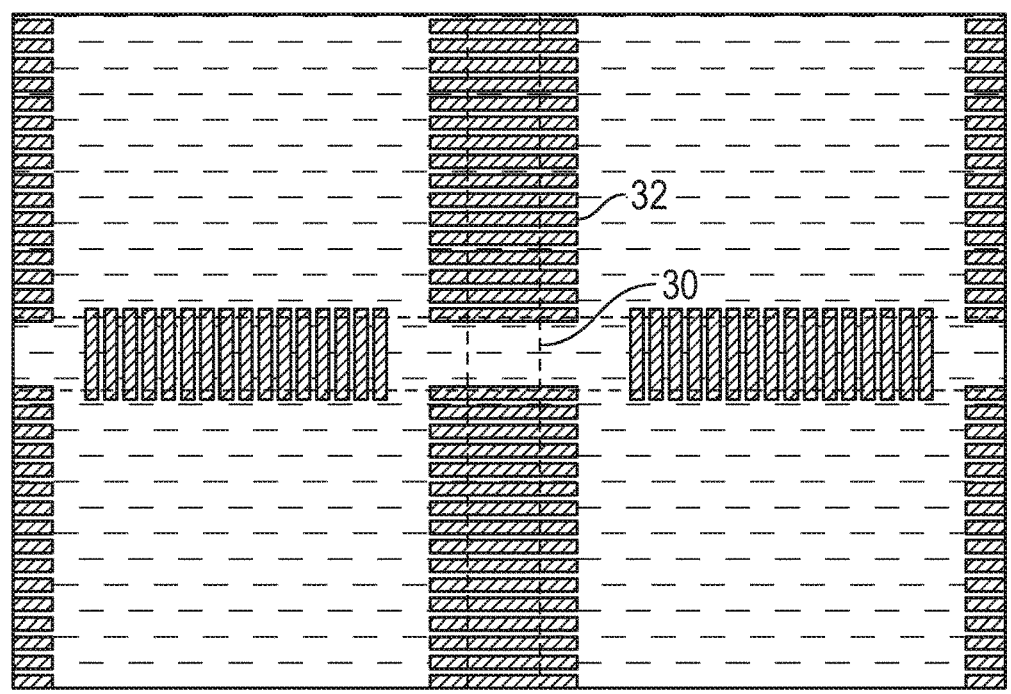
FIG. 4 is a top view of an implementation of an optically transmissive substrate having first redistribution layers on the saw streets.

Referring to FIG. 4, a top view of an optically transmissive substrate 24 is illustrated. A method of forming a semiconductor package may include providing an optically transmissive substrate. Various methods of manufacturing semiconductor packages as described herein may be used including wafer level processes and panel level processes. Panel level processes may have cost and productivity advantages. Panel level processing may allow for parallel processing of more units of semiconductor packages in a given period compared with wafer level processes without the waste of having to process partial die that can occur in wafer level processing. Only a portion of a panel or substrate is illustrated in the following figures but it is understood that the processing continues for each of the various packages included in the remainder of the panel. The optically transmissive substrate includes a first side and a second side as illustrated in FIG. 3. The method includes forming a first redistribution layer (RDL) on a first side of the optically transmissive substrate over one of more scribe lines on the first side of the optically transmissive substrate. The first RDLs are illustrated over the scribe lines in both FIGS. 3 and 4. On the outer edges of the optically transmissive substrate, fragments of the first RDLs are illustrated because only a portion of a panel or substrate is illustrated in the following figures.

Figure 5:
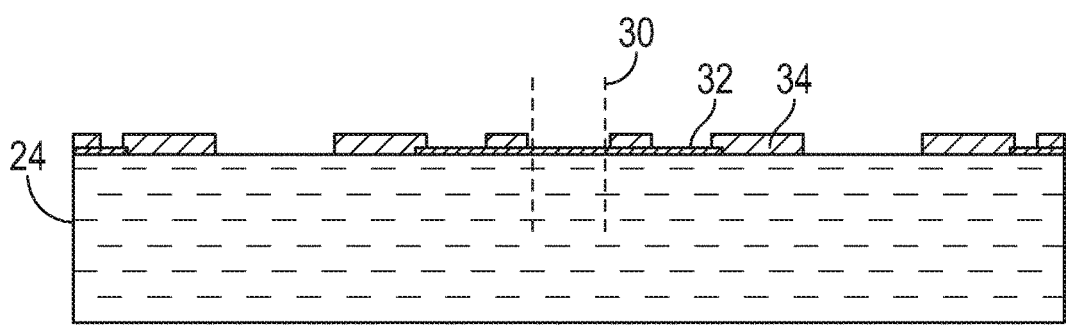
FIG. 5 is a side view of an implementation of an optically transmissive substrate after dam formation.

In various implementations, the method may include forming dams on the optically transmissive substrate. Referring to FIG. 5, one or more dams 34 are illustrated after formation over a portion of the first RDLs 32. In various implementations, the dams may be formed of material including, by non-limiting example, liquid epoxy, silicone, or other encapsulants that may provide device protection, reduce warpage, demonstrate excellent flow, offer good adhesion to multiple substrates, and/or have the strength to handle over-molding and subsequent process steps. In some implementations, adhesive or other material may be formed over the first RDLs on the first side of the optically transmissive substrate 24.

Figure 6:
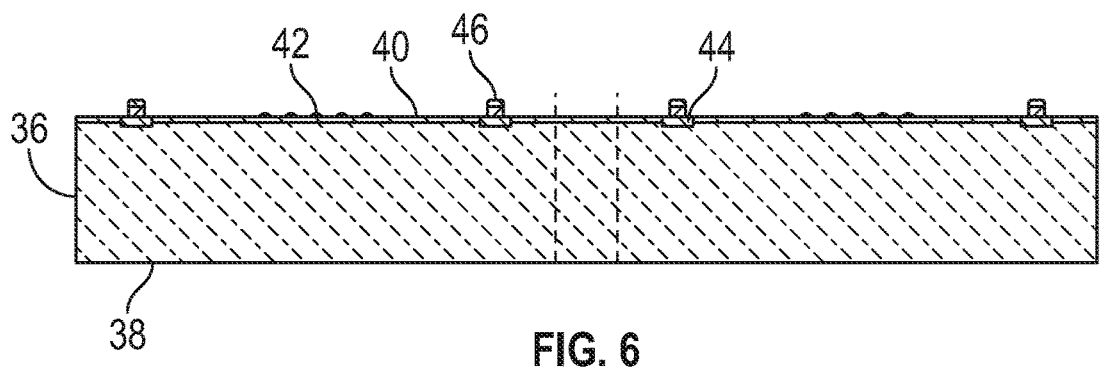
FIG. 6 is a side view of an implementation of a semiconductor wafer after bump formation.

Referring to FIG. 6, an implementation of a semiconductor wafer 36 is illustrated. The semiconductor wafer 36 has a first side 38 and a second side 40. The semiconductor wafer includes a plurality of active areas 42 on the second side of the semiconductor wafer. As illustrated, two die pads 44 are visible on either side of each of the plurality of active areas. In some implementations, more than two die pads may be positioned around each of the plurality of active areas. The method of forming semiconductor packages includes forming inner bumps on each of the die pads. The inner bumps may include conductive materials, such as by non-limiting example, solder and copper. Referring to FIG. 6, the semiconductor wafer 36 is illustrated after formation of the inner bumps 46 on the die pads 44.

Figure 7:
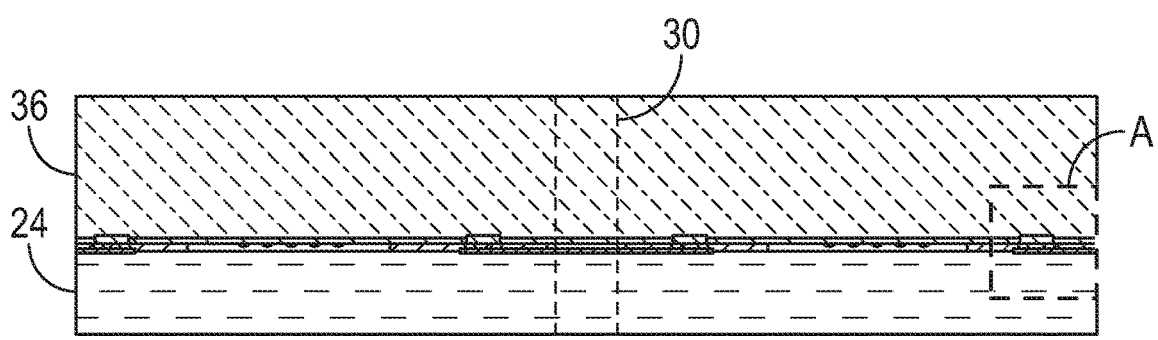
FIG. 7 is a side view of an implementation of an optically transmissive substrate coupled to an implementation of a semiconductor wafer.
Figure 8:
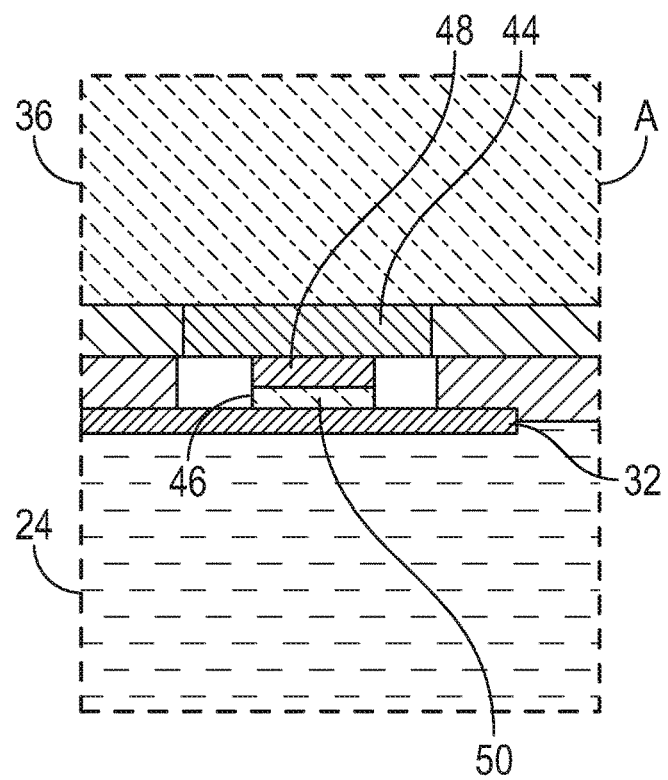
FIG. 8 is a close-up view of an implementation of an inner bump joint coupled between an implementation of an optically transmissive substrate and an implementation of a semiconductor wafer.

The method also includes coupling the second side of the semiconductor wafer to the first side of the optically transmissive substrate. Referring to FIG. 7, the semiconductor wafer 36 is illustrated coupled to the optically transmissive lid 24. As illustrated, the inner bumps are coupled to the optically transmissive lid 24 on either side of the scribe line. Referring to FIG. 8, an enlargement of area A in FIG. 7 is illustrated. In FIG. 8, the interconnection of the inner bump 46 with the first RDL 32 is illustrated. The inner bump 46 provides the mechanical and electrical coupling between the die pad 44 and the first RDL 32. As illustrated in this particular implementation, the inner bump includes two metal layers. In this implementations, the inner bump includes a copper pillar 48 with a solder tip 50. In various implementations, the die pad pitch may be about 70 microns. In other implementations, the inner bump may include only one metallic material such as a solder. In some implementations, the die pad pitch may be about 60 microns. The size of the pad pitch in semiconductor packages formed using the method described herein is smaller than semiconductor packages using TSVs which can have a pad pitch larger than 200 microns.

Figure 9:
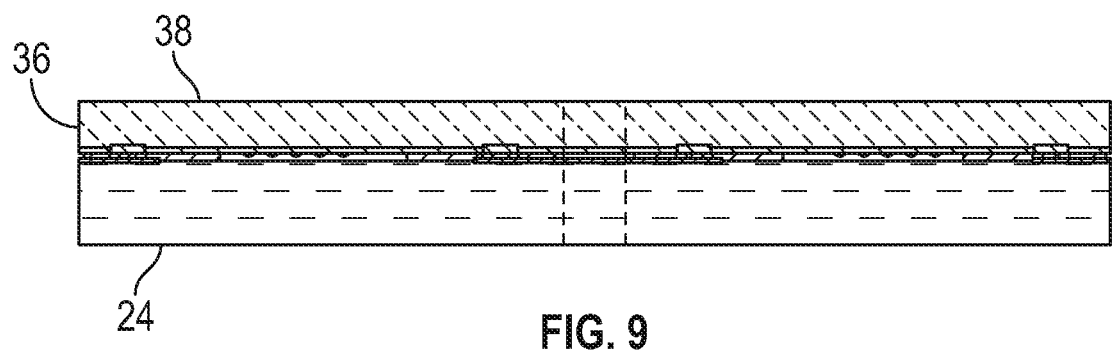
FIG. 9 is a side view of an implementation of an optically transmissive substrate coupled to an implementation of a semiconductor wafer after wafer thinning.

The method also includes thinning the semiconductor wafer 36 on the first side 38 of the semiconductor wafer. In various implementations, the wafer may be thinned through, by non-limiting example, mechanical grinding, chemical mechanical polishing (CMP), wet etching, atmospheric downstream plasma (ADP), dry chemical etching (DCE), or other methods of decreasing the thickness of a semiconductor wafer. Referring to FIG. 9, the semiconductor wafer 36 coupled to the optically transmissive substrate 24 after thinning of the semiconductor wafer is illustrated.

Figure 10:
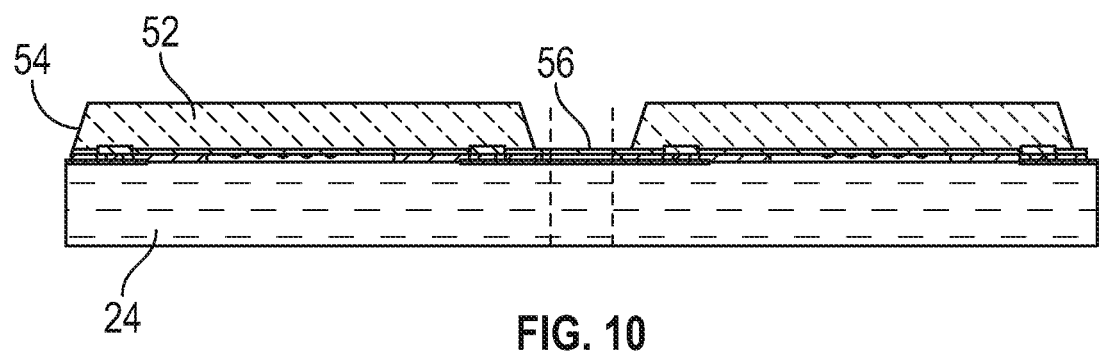
FIG. 10 is a side view of an implementation of an optically transmissive substrate coupled to an implementations of semiconductor die after silicon etching.

The method also includes etching of the semiconductor wafer to form a plurality of semiconductor die each coupled to the transmissive substrate. Each semiconductor die includes an active area on the second side of the die. The semiconductor wafer 36 is therefore etched on and around the scribe lines of the semiconductor wafer on the first side of the semiconductor wafer. In various implementations, etching may include wet etching and dry etching and may involve various patterning steps and operations including photolithography. Referring to FIG. 10, the plurality of semiconductor die 52 coupled to the optically transmissive substrate 24 following etching is illustrated. As illustrated, the sidewalls 54 of the semiconductor die 52 are angled. The sidewalls of the semiconductor die are angled during the etching process. In various implementations, the sidewalls may be angled between 85 degrees and 60 degrees from a plane formed by the first side of the semiconductor die.

Figure 11:
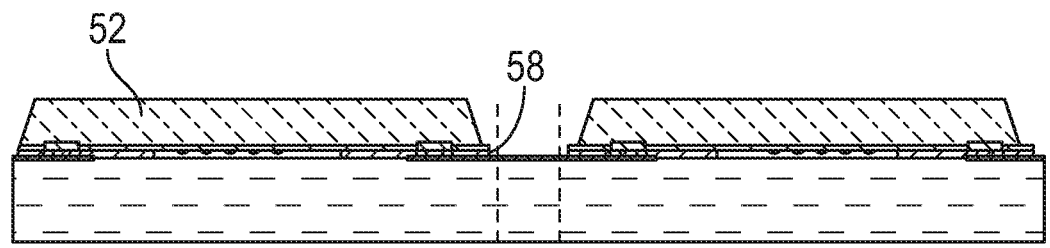
FIG. 11 is a side view of an implementation of semiconductor die coupled to an implementation of an optically transmissive substrate after exposing one or more inner terminals of first RDL on the cover glass.
Figure 12:
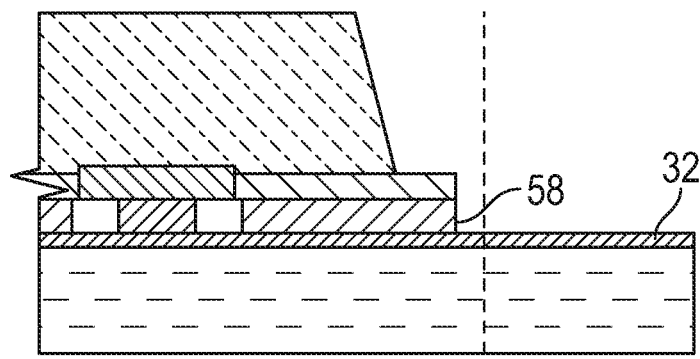
FIG. 12 is a close-up view of an implementation of an exposed redistribution layer (RDL)

The method of forming semiconductor packages without TSVs also includes singulating the semiconductor die and a metal layer 56 remaining after etching the semiconductor wafer. Referring to FIG. 10, the layer of oxide and metal layers is labeled element 56. Referring to FIG. 11, the plurality of die is illustrated after singulation of those layers. Singulating through the semiconductor die and metal layer exposes inner terminals 58 of the first RDL 32 on the optically permissive substrate 24. In various implementations, one or more inner terminals may be exposed after singulating. Singulation may be performed through laser cutting, sawing, etching, or other methods capable of severing semiconductor material and metal layers. Referring to FIG. 12, an enlarged view of the inner terminals 58 of the first RDL 32 is illustrated after singulation of the metal layers.

Figure 13:
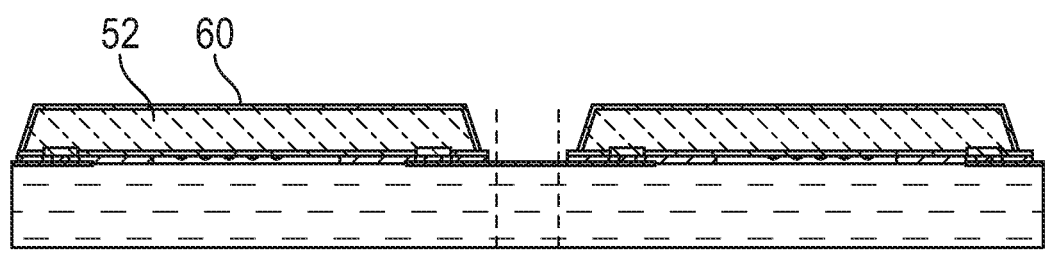
FIG. 13 is a side view of an implementation of semiconductor die coupled to an implementation of an optically transmissive substrate after forming an isolation layer around the plurality of semiconductor die.

The method also includes forming an isolation/passivation layer 60 over each of the plurality of semiconductor die. The isolation layer 60 is formed over the first side and the sidewalls of each of the plurality of semiconductor die. In various implementations, the isolation layer may extend to the one or more dams between the semiconductor die and the optically transmissive substrate. In some implementations, the isolation layer may include, by non-limiting example, aluminum oxide, silicon dioxide, silicon nitride, aluminum nitride, and other dielectric materials. Referring to FIG. 13, each of the plurality of semiconductor die are illustrated after formation of the isolation layer 60.

Figure 14:
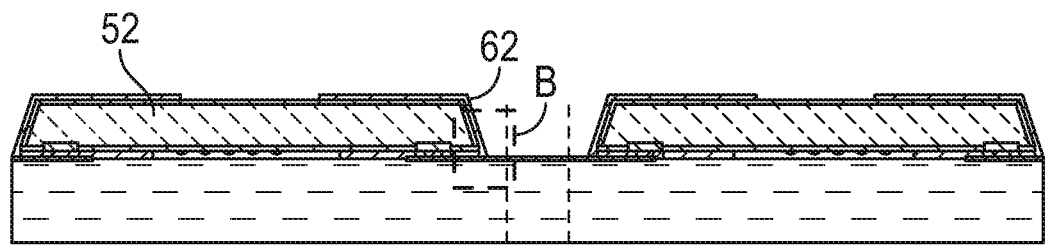
FIG. 14 is a side view of an implementation of semiconductor die coupled to an implementation of an optically transmissive substrate after formation of a second redistribution layer (RDL)
Figure 15:
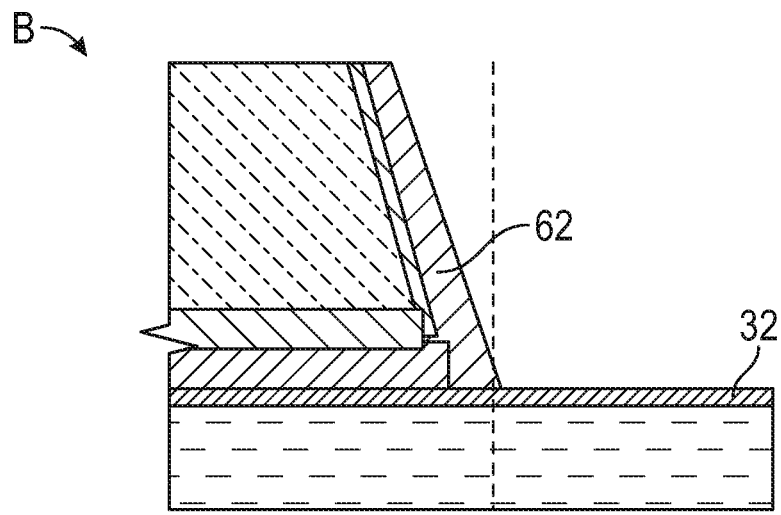
FIG. 15 is a close-up view of an implementation of the first RDL coupled with the second RDL.

The method also includes forming a second redistribution layer (RDL). The second RDL extends from the inner terminals of the first RDL to the first side of each of the plurality of semiconductor die. Referring to FIG. 14, the plurality of die 52 are illustrated after formation of the second RDL 62. In various implementations, the second RDL may be formed of similar material as the first RDL and include a combination of dielectric material and electrically conductive material. By non-limiting example, the RDLs described herein may include, by non-limiting example, polyimide, titanium, copper, nickel, aluminum, alloys thereof, any combination thereof, and other suitable combinations of materials to protect/insulate the semiconductor die and provide conductivity between the die pads of the semiconductor die and the outer electrical terminals of the device. Referring to FIG. 15, an enlargement of area B in FIG. 14 is illustrated. In FIG. 15, the second RDL 62 is illustrated as a single structure (though it is a multi-layered structure) mechanically coupling with the first RDL 32. The second RDL 62 is also electrically coupled with the first RDL 32 and provides connectivity between the first side of the semiconductor die and the second side of the semiconductor die. The second RDL will also provide electrical connectivity to the surface mount interconnect elements and any electrical connection elements within the semiconductor die.

Figure 16:
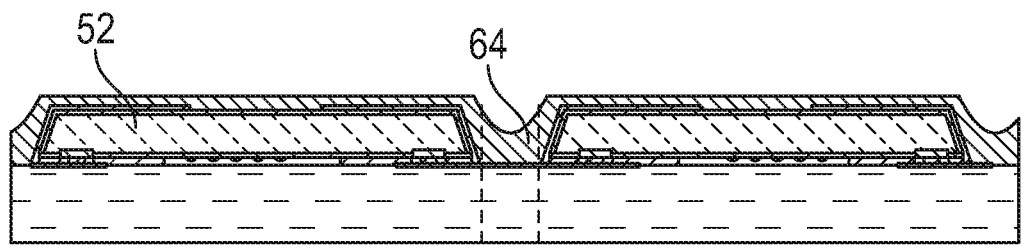
FIG. 16 is a side view of an implementation of semiconductor die coupled to an implementation of an optically transmissive substrate after forming a passivation layer.
Figure 17:
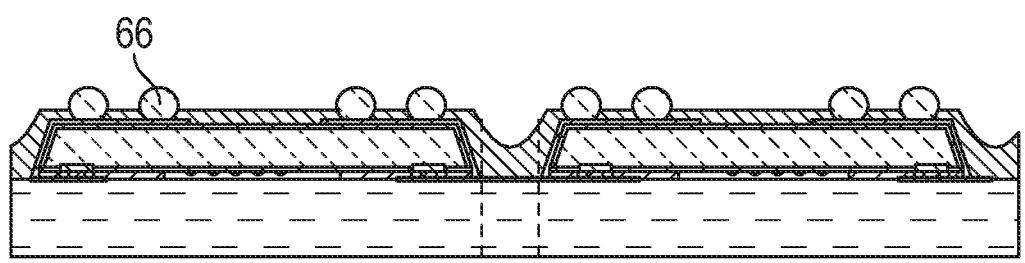
FIG. 17 is a side view of an implementation of semiconductor die coupled to an implementation of an optically transmissive substrate after formation of bumps on the first side of the semiconductor die.

The method also includes forming a passivation layer over each of the plurality of semiconductor die. The passivation layer may protect the semiconductor device from corrosion. In various implementations, the passivation layer may include, by non-limiting example, oxides, nitrides, polyimides and any other material capable of protecting the surface of the semiconductor die. Referring to FIG. 16, the plurality of semiconductor die 52 are illustrated after formation of the passivation layer 64. As illustrated, the passivation layer 64 covers the first side of each of the semiconductor die and also covers the sidewalls of the semiconductor die. The passivation layer couples with the optically transmissive substrate and encapsulates the first RDL and the second RDL. In various implementations, the method includes coupling one or more interconnects with the first side of the semiconductor die. As illustrated in FIG. 17, the interconnects may include a plurality of solder balls 66. The placement and coupling the solder balls 66 may include patterning and etching steps of the passivation layer material to expose the contacts/pads to which the solder balls couple (and some deposition steps if underbump metallizations are employed). In other implementations, the interconnects may include ball grid arrays, copper pillars, or other electrically conductive material for surface mount devices.

Figure 18:
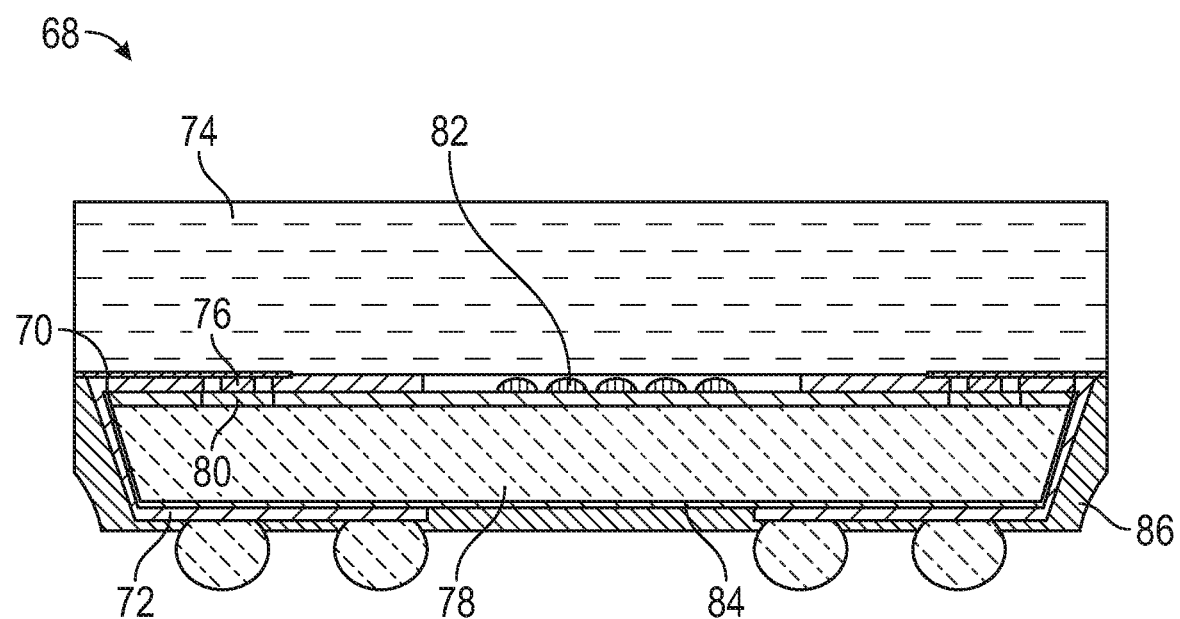
FIG. 18 is a cross sectional view of an implementation of a semiconductor package without through silicon vias (TSVs).

The method includes singulating through the passivation layer and the optically transmissive substrate to form a plurality of semiconductor packages. In various implementations, singulating may be performed through, by non-limiting example, sawing, laser cutting, any combination thereof, and other methods for singulating through materials such as glass, metal, plastics, and/or semiconductor materials. Referring to FIG. 18, an implementation of a semiconductor package 68 after singulation is illustrated. As previously described, the semiconductor package 68 includes a first RDL 70 and a second RDL 72 to provide electrical connectivity to the device without the use of TSVs. The first RDL 72 is coupled to the optically transmissive lid 74. In various implementations, the optically transmissive lid may include, by non-limiting example, glass, polycarbonate, acrylic, plastics, or other materials that allow some or all of a desired wavelength of light to pass through the material. The first RDL is also mechanically and electrically coupled with inner bumps 76 which are coupled to the second side of the semiconductor die 78 through die pads 80. In various implementations, two or more die pads are positioned around the active area of the die. The active area 82 of the die 78 may include a sensor area of an image sensor die. The semiconductor die is encapsulated in an isolation layer 84. The semiconductor device including the first RDL 70, second RDL 72, and the isolation layer 84 are encapsulated in a passivation layer 86. In this particular implementation, solder balls are coupled to the second RDL through openings in the passivation layer. In various implementations, other surface mount connection types (pins, studs, stud bumps, pads, etc.) may be used.

In places where the description above refers to particular implementations of semiconductor packages and implementing components, sub-components, methods and sub-methods, it should be readily apparent that a number of modifications may be made without departing from the spirit thereof and that these implementations, implementing components, sub-components, methods and sub-methods may be applied to other semiconductor packages.

What is claimed is:

1. A semiconductor package comprising:
    a semiconductor die comprising a first side and a second side;
    an active area comprised on the second side of the die;
    two or more interconnect bumps coupled to two or more die pads on the second side of the die;
    an optically transmissive lid coupled to the semiconductor die through an adhesive, the two or more interconnect bumps, and a first redistribution layer (RDL); and
    a second redistribution layer (RDL) coupled with the first RDL on the second side of the semiconductor die and extending to the first side of the semiconductor die;
    wherein the first RDL extends to an edge of the semiconductor die; and
    wherein the two or more interconnect bumps are copper pillars comprising solder tips.

2. The semiconductor package of claim 1, wherein a pad pitch of the two or more interconnect bumps is substantially 60 microns.

3. The semiconductor package of claim 1 wherein a pad pitch of the two or more interconnect bumps is substantially 70 microns.

4. The semiconductor package of claim 1, wherein one or more side walls of the semiconductor die are angled between 85 degrees and 60 degrees from a plane formed by the first side of the semiconductor die.

5. A semiconductor package comprising:
a semiconductor die comprising a first side and a second side;
an active area comprised on the second side of the die;
two or more copper pillars coupled to the second side of the die on either side of the active area;
a first redistribution layer (RDL) coupled to each of the two or more copper pillars and extending to an edge of the semiconductor die;
an optically transmissive lid coupled to the semiconductor die through the two or more copper pillars and the first RDL; and
a second redistribution layer (RDL) coupled with the first RDL on the second side of the semiconductor die, the second RDL extending to the first side of the semiconductor die; and
wherein the two or more copper pillars comprise solder tips.

6. The semiconductor package of claim 5, wherein the two or more copper pillars are coupled to two or more die pads.

7. The semiconductor package of claim 5, wherein a pad pitch of the two or more copper pillars is substantially 60 microns.

8. The semiconductor package of claim 5, wherein a pad pitch of the two or more copper pillars is substantially 70 microns.

9. The semiconductor package of claim 5, wherein one or more sidewalls of the semiconductor die are angled between 85 degrees and 60 degrees from a plane formed by the first side of the semiconductor die.

* * * * *